(12) United States Patent
Chen et al.

(10) Patent No.: US 6,316,311 B1
(45) Date of Patent: Nov. 13, 2001

(54) METHOD OF FORMING BORDERLESS CONTACT

(75) Inventors: Tung-Po Chen, Taichung; Tong-Yu Chen, Hsinchu; Keh-Ching Huang, Hsinchu; Jacob Chen, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/203,036

(22) Filed: Dec. 1, 1998

(51) Int. Cl.⁷ .................................. H01L 21/8242
(52) U.S. Cl. ................ 438/253; 438/233; 438/256; 438/523; 438/597
(58) Field of Search ............................ 438/233, 241, 438/253, 256, 523, 532, 533, 571, 597, 618, 634

(56) References Cited

U.S. PATENT DOCUMENTS 5,545,581 * 8/1996 Armacost et al. .................. 438/253
5,714,394 * 2/1998 Kadosh et al. ..................... 438/618
5,731,236 * 3/1998 Chou et al. ......................... 438/253
5,753,565 * 5/1998 Becker et al. ...................... 438/586
5,766,992 * 6/1998 Chou et al. ......................... 438/241

\* cited by examiner

*Primary Examiner*—Charles Bowers
*Assistant Examiner*—Jack Chen

(57) ABSTRACT

A method of forming borderless contacts is provided. A substrate is provided. The substrate has at least a logic region and a memory region. A MOS transistor and a STI structure are formed on the logic region. The MOS transistor comprises a gate, a source/drain region and a cap insulating layer on the gate. An etching stop layer is formed on the substrate to cover the MSO transistor and the STI structure. A dielectric layer is formed in the etching stop layer. The dielectric layer, the etching stop layer and the cap insulating layer are partially removed to form a first opening according to the pattern of a first mask layer. The first opening exposes the gate. According to the pattern of a second mask layer, the dielectric layer and the etching stop layer are partially removed to form openings, which expose the source/drain region, in the dielectric layer.

17 Claims, 6 Drawing Sheets

US 6,316,311 B1

METHOD OF FORMING BORDERLESS CONTACT

BACKGROUND OF THE INVENTION

1. Field of the Invention

The invention relates in general to the method of forming semiconductor circuits (ICs), and more particularly to a method of forming borderless contacts.

2. Description of the Related Art

The line width of a metal oxide semiconductor (MOS) becomes smaller and smaller when device integration increases. A metal line is used to contact the source/drain region of the MOS. Since the size of the source/drain region is smaller than the metal line or misalignment occurs between the source/drain region and the metal line, a part of the metal line contacts a shallow trench isolation structure (STI). According the result described above, a borderless contact process is provided to ensure the insulating effect of the STI without decreasing the device integration.

FIGS. 1A to 1D are schematic, cross-sectional views showing the progression of manufacturing steps in producing a borderless contact according to a conventional method.

In FIG. 1A, a substrate 100 is provided. The substrate 100 has at least a MOS transistor and STI structures 102 near the MOS transistor thereon. The MOS transistor comprises a gate 107, a spacer 108, a source region 104 and a drain region 106. The gate 107 comprises a salicide layer 112, a polysilicon layer 110 and a gate oxide layer 113. A titanium silicide layer 109 is formed on the source region 104 and the drain region 106. A silicon nitride layer 114 is formed over the substrate 100 to cover the MOS transistor and the STI structures 102. A dielectric layer 116 is formed on the silicon nitride layer 114.

In FIG. 1B, a defined photoresist layer 118 is formed on the dielectric layer 116. The photoresist layer 118 has a first opening 115 exposing the drain region 106, a second opening 117 exposing the gate 107 and a third opening 119 exposing the source region 104.

In FIG. 1C, a part of the dielectric layer 116 is removed until the silicon nitride layer 114 is exposed using the photoresist layer as a mask layer. A fourth opening 121, a fifth opening 123 and a sixth opening 125 are thus formed in the dielectric layer 116.

In FIG. 1D, the exposed silicon nitride layer 14 is removed to form a first contact window 120 to expose the source region 106, to form a second contact window 122 to expose the gate 107, and to form a third contact window 124 to expose the drain region 104. The photoresist layer 118 is removed. A part of the third contact window 124 exposes the STI structure 102.

In the conventional method described above, the MOS transistor is used to form logic devices. A part of the silicon nitride layer 114 over the gate has the same thickness as another part of the silicon nitride layer 114 over the source/drain region so that an etching step for forming the contact windows requires only one mask. However, an embedded dynamic random access memory (DRAM) comprises a logic region and a memory cell region. A gate in the logic region comprises a cap layer, a polycide layer, a polysilicon layer and a gate oxide layer. The silicon nitride layer on the gate is thicker than the silicon nitride layer on the source/drain region. In the logic region of the embedded DRAM, using one mask for forming contact windows exposing the gate and the source/drain region is very difficult.

SUMMARY OF THE INVENTION

It is therefore an object of the invention to provide a method of forming borderless contacts for application in a fabrication process for forming embedded DRAMs. The method uses two masks to form a borderless contact while performing an embedded DRAM process. One of the masks is used for forming a first contact window to expose the gate. The other mask is used for forming second contact windows to expose the source/drain region.

The invention achieves the above-identified objects by providing a method of forming borderless contacts. A substrate is provided. The substrate has at least a logic region and a memory region. A MOS transistor and an STI structure are formed on the logic region. The MOS transistor comprises a gate, a source/drain region and a cap insulating layer on the gate. An etching stop layer is formed on the substrate to cover the MOS transistor and the STI structure. A dielectric layer is formed in the etching stop layer. The dielectric layer, the etching stop layer and the cap insulating layer are partially removed to form a first opening according to the pattern of a first mask layer. The first opening exposes the gate. According to the pattern of a second mask layer, the dielectric layer and the etching stop layer are partially removed to form openings, which expose the source/drain regions, in the dielectric layer.

BRIEF DESCRIPTION OF THE DRAWINGS

Other object, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
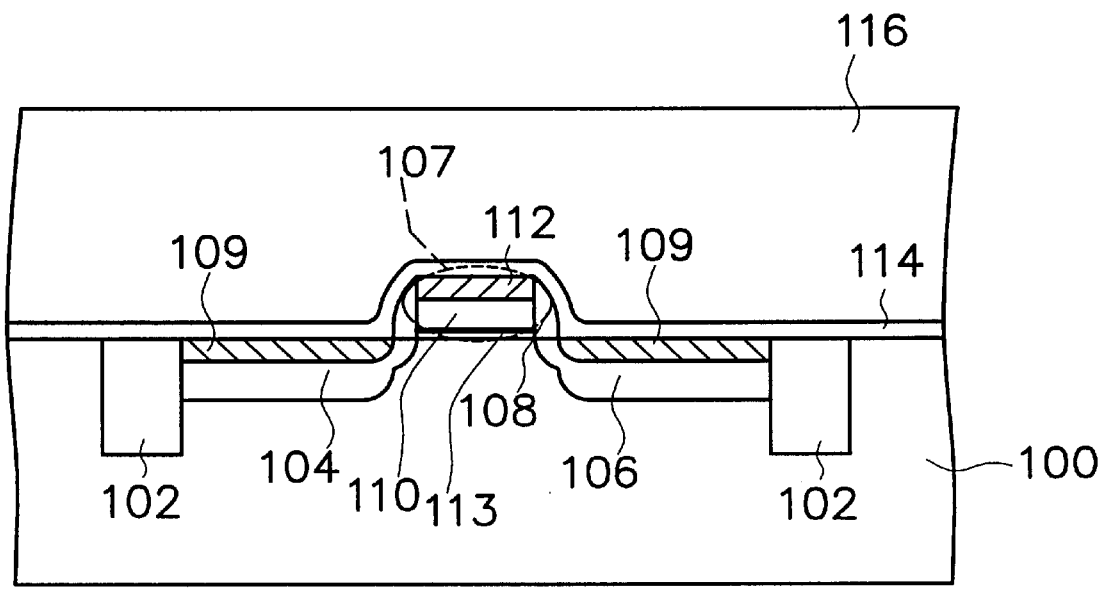
FIGS. 1A to 1D are schematic, cross-sectional views showing the progression of manufacturing steps in producing a borderless contact according to a conventional method.
Figure 1B:
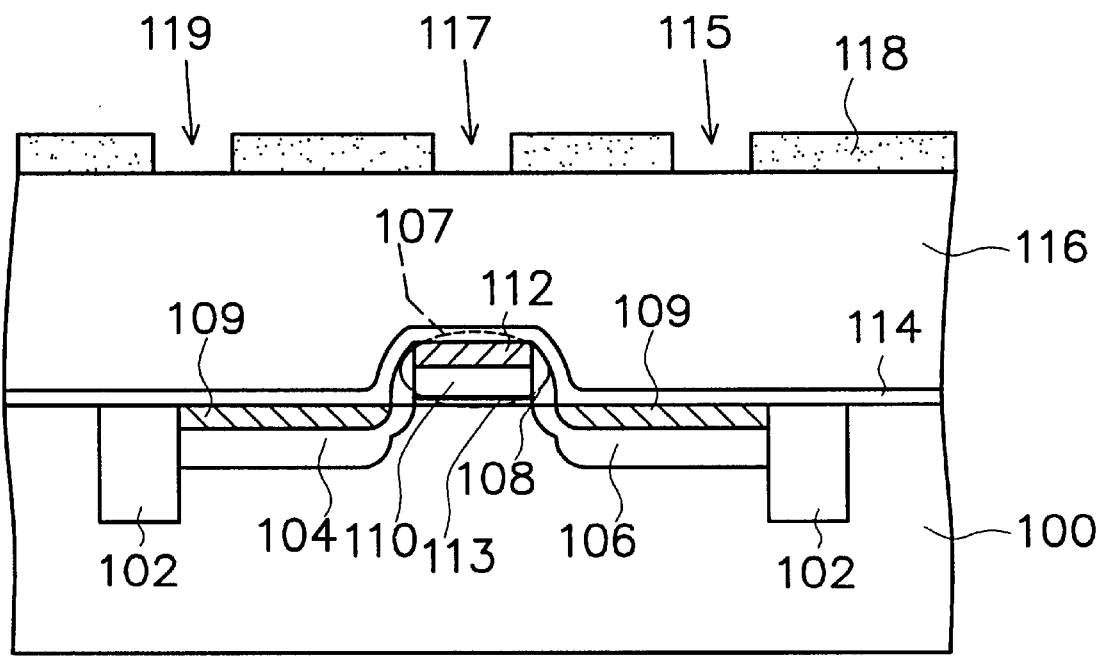
Figure 1C:
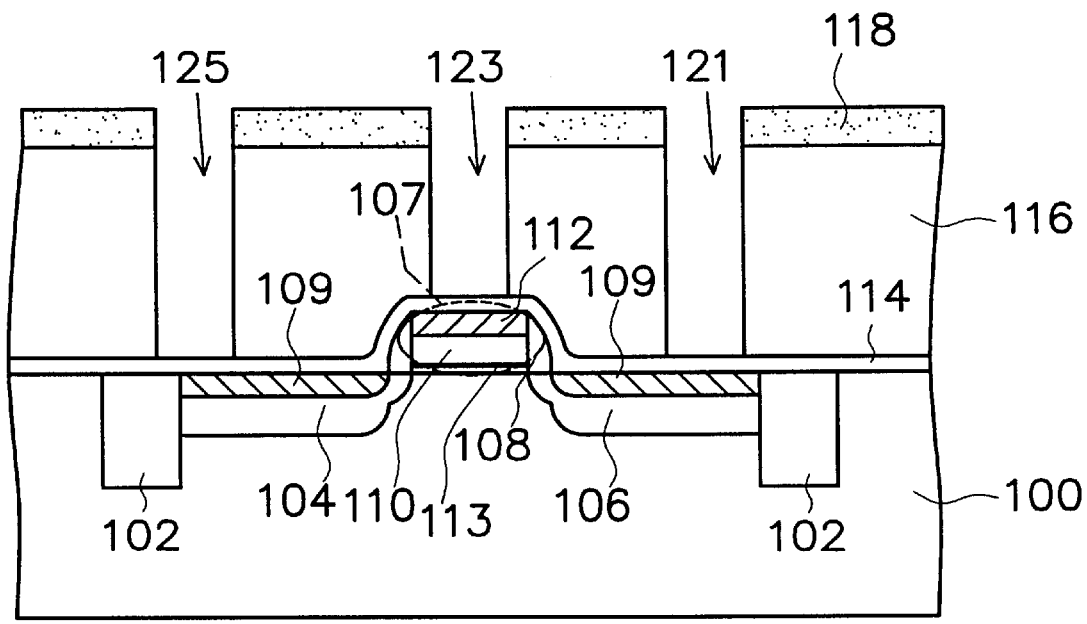
Figure 1D:
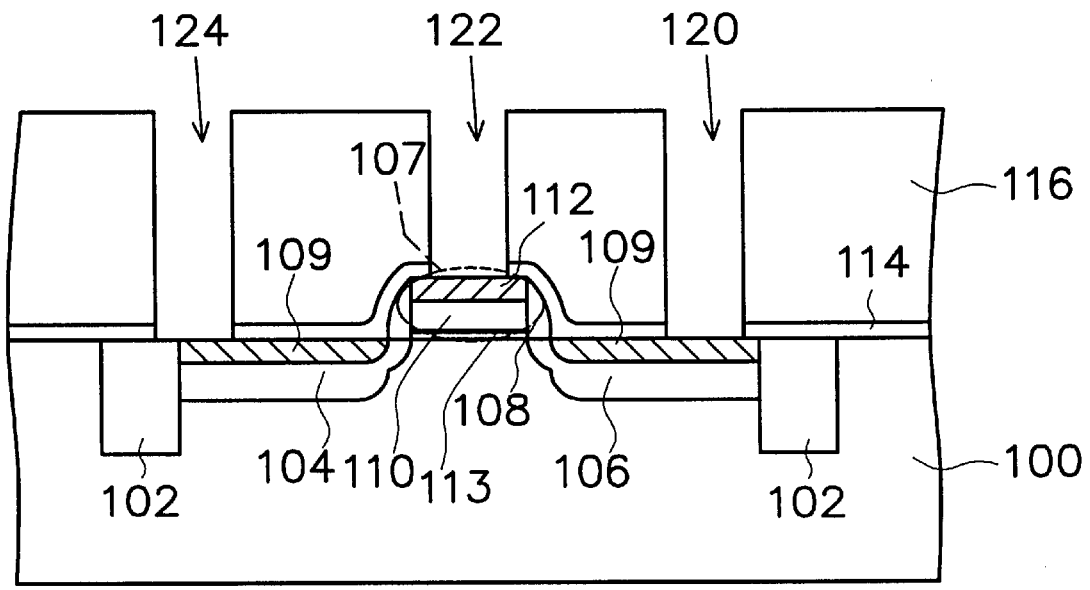
Figure 2A:
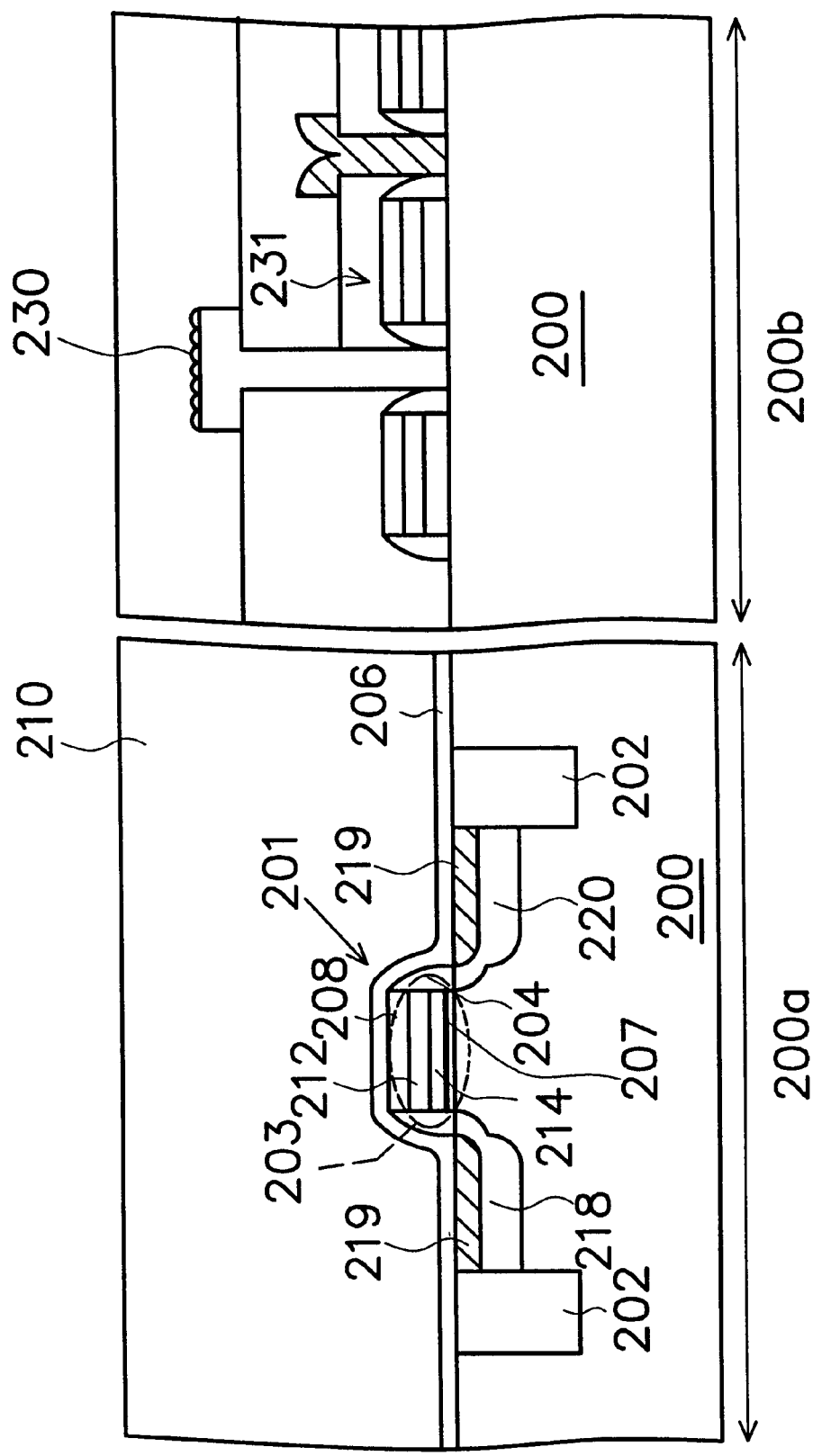
FIGS. 2A to 2G are schematic, cross-sectional views showing the process of one preferred embodiment of the method of forming borderless contacts.

In FIG. 2A, a substrate 200 is provided. The substrate 200 has at least a logic region 200a and a memory region 200b. The logic region 200a comprises a MOS transistor 201 and a STI structure 202 formed thereon. The MOS transistor 201 comprises a gate 203, a spacer 204, a source region 218 and a drain region 220. The gate 203 consists of a polycide layer 212, a polysilicon layer 214 and a gate oxide layer 207. A cap insulating layer 208 is formed on the gate 203. The material of the cap insulating layer 208 comprises silicon nitride with a thickness of about 1000–2000 Å. A silicide layer 219, such as a titanium silicide layer, is formed on the source/drain region 218/220 to decrease the sheet resistance of the source/drain region 218/220.

An etching stop layer 206 is formed, for example, by chemical vapor deposition (CVD) and over the substrate 200 to cover the MOS transistor 201 and the STI structure 202. A dielectric layer 210 is formed, for example, by CVD on the etching stop layer 206. The material of the etching stop layer 206 comprises silicon nitride with a thickness of about 300–500 Å. The material of the dielectric layer 210 comprises borophosphosilicate glass (BPSG). Furthermore, the memory region 200b comprises a MOS transistor 231 and a capacitor 230. Since the emphasis of the invention is forming contact windows on the logic region 200a, the cross-sectional views of the memory region 200b are not shown in FIGS. 2B to 2G.

Figure 2B:
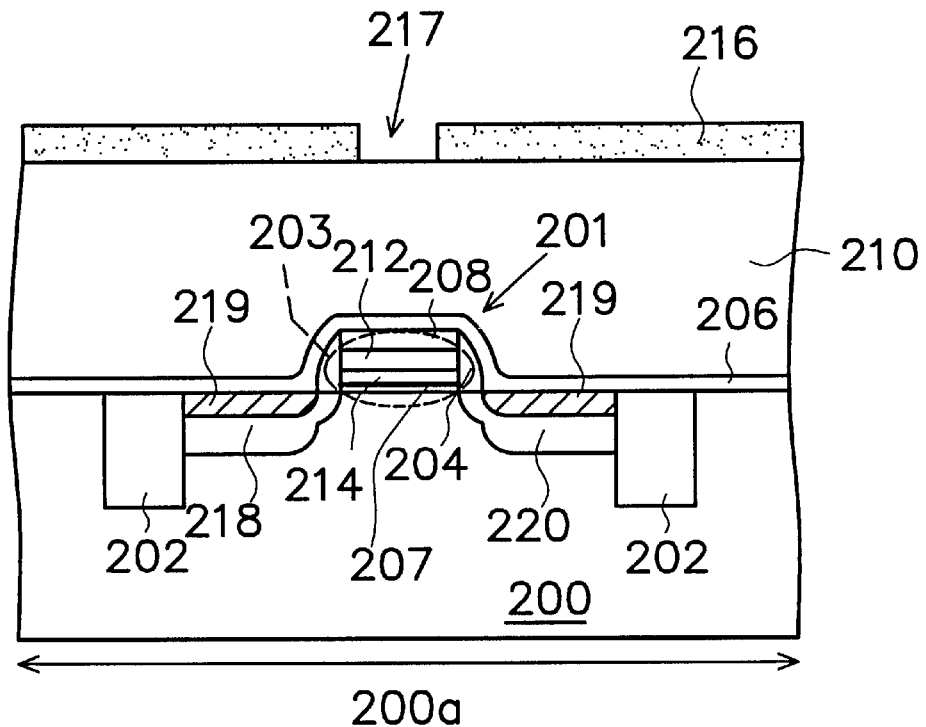

In FIG. 2B, a defined first mask layer 216, such as a photoresist layer, is formed on the dielectric layer 210. The first mask layer 216 has a first opening 217 positioned directly above the gate 203.

Figure 2C:
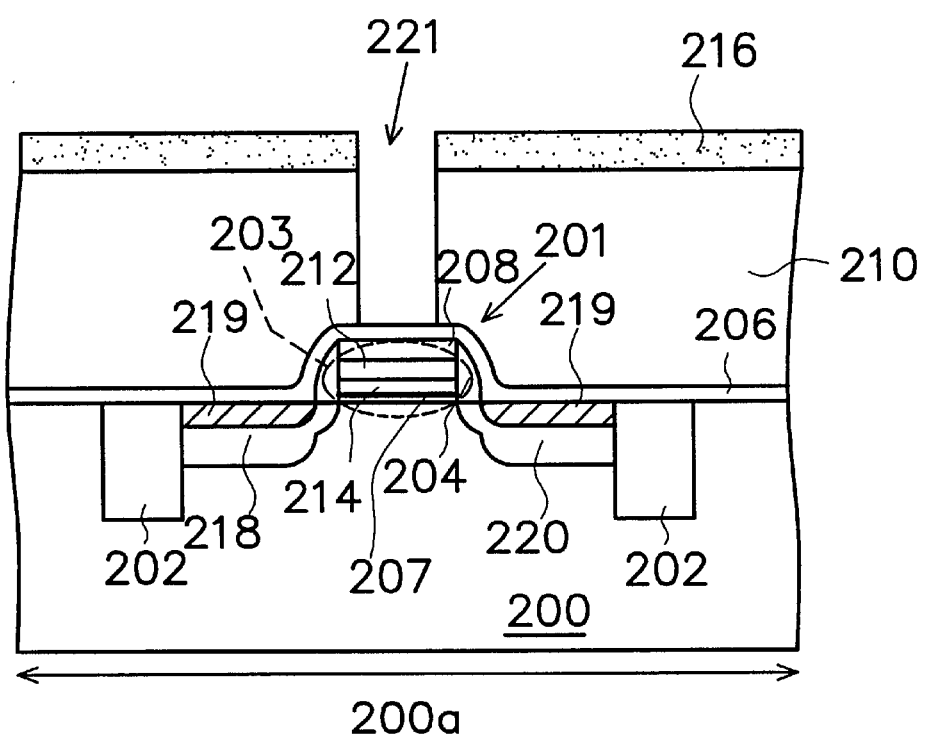

In FIG. 2C, a part of the dielectric layer 210 is removed, for example, by anisotropic etching until exposing the etching stop layer 206. A second opening 221 is thus formed in the dielectric layer 210.

Figure 2D:
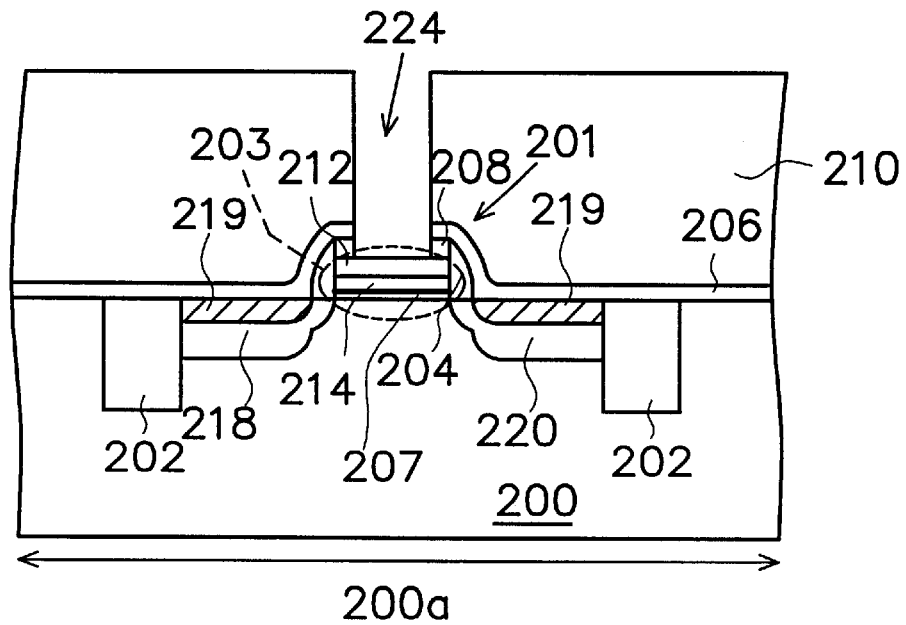

In FIG. 2D, the exposing etching stop layer 206 and the cap insulating layer 208 under the etching stop layer 206 are removed, for example, by anisotropic etching to form a first contact window 224 exposing the gate 203. The first mask layer 216 is removed.

Figure 2E:
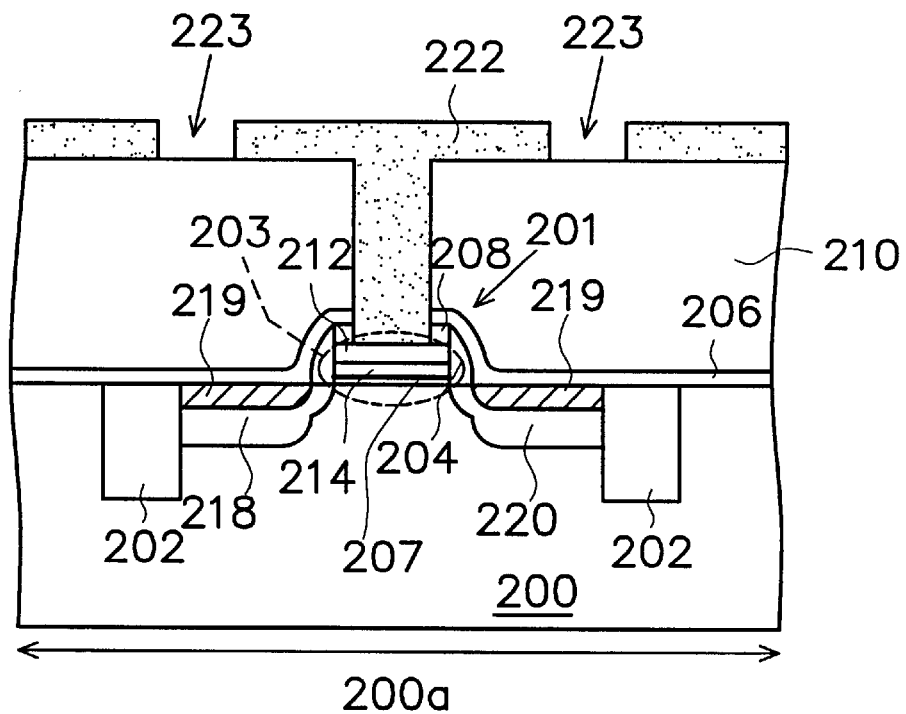

In FIG. 2E, a defined second mask layer 222, such as a photoresist layer, is formed on the dielectric layer 210. The second mask layer 222 has a third opening 223 positioned directly above the source/drain region 218/220.

Figure 2F:
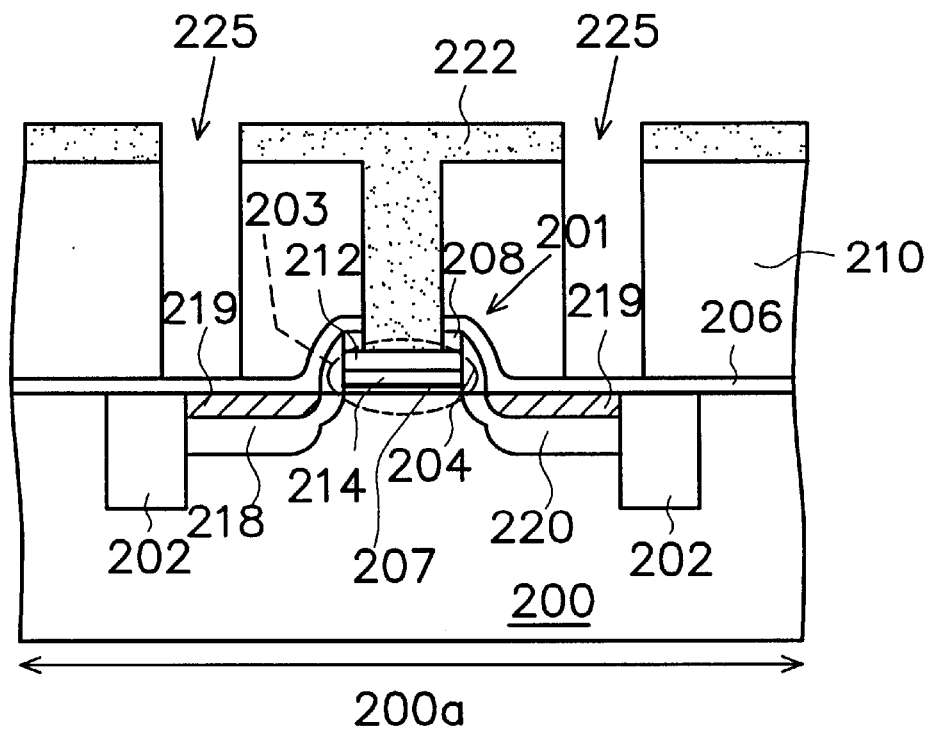

In FIG. 2F, a part of the dielectric layer 210 is removed, for example, by anisotropic etching until exposing the etching stop layer 206. A fourth opening 225 is thus formed in the dielectric layer 210.

Figure 2G:
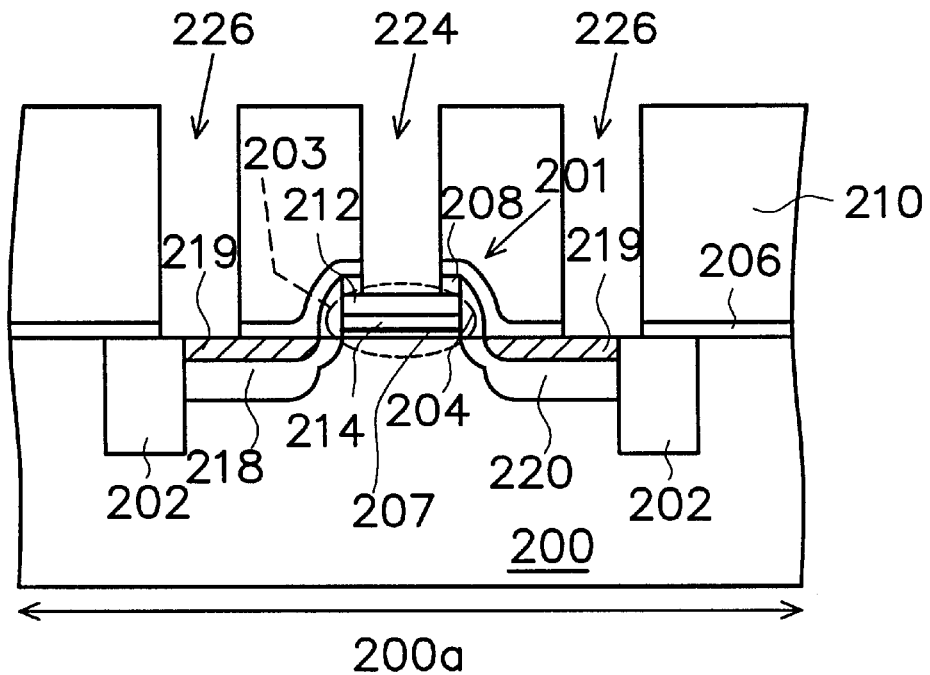

In FIG. 2G, the etching stop layer 206 exposed by the fourth opening 225 is removed, for example, by anisotropic etching to form a second contact window 226 exposing the source/drain region 218/220. The second mask layer 222 is removed. The second contact window 226 exposes a part of the STI structure 202 while the source/drain region 218/220 is exposed so that the second contact window 226 is a borderless contact.

The feature of the invention is the use of two mask layers to form the borderless contact while forming an embedded DRAM. A first mask layer is used to form a contact window exposing the gate. A second mask layer is used to form contact windows exposing the source/drain region. However, the silicon nitride layer, that is, the etching stop layer 206, over the gate is thicker than the silicon nitride layer over the source/drain region. A borderless contact is still formed to expose the source/drain region according the method provided by the invention.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming borderless contacts, which is applied to form an embedded dynamic random access memory on a substrate having at least a metal oxide semiconductor transistor located at a logic region of the substrate, which comprises a gate, a source/drain region and a cap insulating layer on the gate, and a shallow trench isolation structure thereon, comprising the steps of:

forming an etching step layer on the substrate to cover the metal oxide semiconductor transistor and the shallow trench isolation structure;

forming a dielectric layer on the etching stop layer;

forming a defined first mask layer on the dielectric layer, wherein the defined first mask layer has a first opening over the gate and wherein a portion of the dielectric layer is exposed in the first opening;

removing the dielectric layer exposed in the first opening, the etching stop layer and the cap insulating layer under the exposed dielectric layer to form a first contact window exposing the gate;

removing the defined first mask layer;

forming a defined second mask layer on the dielectric layer, wherein the defined second mask layer has a second opening over the source/drain region and a portion of the shallow trench isolation, wherein a portion of the dielectric layer is exposed in the second opening;

removing the dielectric layer exposed by the second opening and the etching stop layer to form a second contact window exposing the source/drain region of the same metal oxide semiconductor transistor and a portion of the shallow trench isolation; and removing the defined second mask layer.

2. The method according to claim 1, wherein the cap insulating layer comprises a silicon nitride layer.

3. The method according to claim 1, wherein the cap insulating layer has a thickness of about 1000–2000 Å.

4. The method according to claim 1, wherein the etching stop layer comprises a silicon nitride layer.

5. The method according to claim 1, wherein the etching stop layer has a thickness of about 300–500 Å.

6. The method according to claim 1, wherein the dielectric layer comprises a borophosphosilicate layer.

7. The method according to claim 1, wherein the source/drain region further comprises a silicide layer formed thereon.

8. A method of forming borderless contacts for an embedded dynamic random access memory, comprising the steps of:

providing a substrate, wherein the substrate has a metal oxide semiconductor transistor located at a logic region of the substrate, which comprises a gate, a source/drain region and a cap insulating layer on the gate, and a shallow trench isolation structure thereon;

forming an etching stop layer on the substrate to cover the metal oxide semiconductor transistor and the shallow trench isolation structure;

forming a dielectric layer on the etching stop layer;

forming a first contact window to expose the gate by using a first mask and forming a second contact window to expose the source/drain region of the same metal oxide semiconductor transistor by using a second mask, wherein the first and second masks are formed in different steps.

9. The method according to claim 8, wherein the cap insulating layer comprises a silicon nitride layer.

10. The method according to claim 8, wherein the cap insulating layer has a thickness of about 1000–2000 Å.

11. The method according to claim 8, wherein the etching stop layer comprises a silicon nitride layer.

12. The method according to claim 8, wherein the etching stop layer has a thickness of about 300–500 Å.

13. The method according to claim 8, wherein the dielectric layer comprises a borophosphosilicate layer.

14. The method according to claim 8, wherein the second contact window exposes a part of the shallow trench isolation structure.

15. The method according to claim 8, wherein the source/drain region further comprises a silicide layer forming thereon.

16. A method of forming contact for an embedded dynamic random access memory, comprising:

providing a metal oxide semiconductor transistor located at a logic region of the substrate, which at least comprises a gate and a source/drain region;

forming an etching stop layer on the gate and the source/drain region;

forming a dielectric layer on the etching stop layer;

performing a first etching step using a first mask to form a first contact window exposing the gate; and performing a second etching step using a second mask to form a second contact window exposing the source/drain region of the same metal oxide semiconductor transistor, the second contact window being borderless, wherein the first and second masks are formed in different steps.

17. A method according to claim 16, wherein the gate exposed within the first contact window is covered by a photoresist material used as the second mask during the process of forming the second contact window.

* * * * *